United States Patent
Chu et al.

(10) Patent No.: US 12,402,416 B2
(45) Date of Patent: Aug. 26, 2025

(54) ELECTROSTATIC DISCHARGE DIODES WITH DIFFERENT SIZES AND METHODS OF MANUFACTURING THEREOF

(71) Applicant: Taiwan Semiconductor Manufacturing Company, Ltd., Hsinchu (TW)

(72) Inventors: Li-Wei Chu, Hsinchu (TW); Jam-Wem Lee, Hsinchu (TW); Wun-Jie Lin, Hsinchu (TW); Shou Ming Liu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 193 days.

(21) Appl. No.: 18/473,749

(22) Filed: Sep. 25, 2023

(65) Prior Publication Data
US 2025/0107244 A1    Mar. 27, 2025

(51) Int. Cl.
*H02H 9/04* (2006.01)
*H10D 84/01* (2025.01)
(Continued)

(52) U.S. Cl.
CPC .......... *H10D 89/611* (2025.01); *H02H 9/046* (2013.01); *H10D 84/0112* (2025.01);
(Continued)

(58) Field of Classification Search
CPC .................. H02H 9/046; H10D 89/611
See application file for complete search history.

(56) References Cited

U.S. PATENT DOCUMENTS

| | | | | |
|---|---|---|---|---|
| 5,572,394 A | * | 11/1996 | Ker | H10D 89/601 |
| | | | | 361/111 |
| 7,885,046 B1 | * | 2/2011 | Gallerano | H10D 89/713 |
| | | | | 361/56 |

(Continued)

FOREIGN PATENT DOCUMENTS

| TW | 200509363 A | 3/2005 |
| TW | 201535663 A | 9/2015 |
| TW | 202015180 A | 4/2020 |

OTHER PUBLICATIONS

Office Action issued in connection with Taiwan Appl. No. 112145500 dated Sep. 4, 2024.

*Primary Examiner* — Scott Bauer
(74) *Attorney, Agent, or Firm* — FOLEY & LARDNER LLP

(57) ABSTRACT

A semiconductor device includes a first diode having a first cathode and a first anode, wherein the first cathode is floating. The semiconductor device includes a second diode having a second cathode and a second anode, wherein the first anode is coupled to the second anode with the second cathode connected to a first supply voltage. The semiconductor device includes a third diode having a third cathode and a third anode, wherein the third cathode is connected to the first anode at an input/output pin, with the third anode connected to a second supply voltage. The second anode is coupled to a circuit that is powered by the first supply voltage and the second supply voltage. The first diode has a first size and the second diode has a second size, and the first size is substantially greater than the second size.

20 Claims, 20 Drawing Sheets

(51) Int. Cl.
 *H10D 84/03* (2025.01)
 *H10D 89/60* (2025.01)

(52) U.S. Cl.
 CPC ......... *H10D 84/038* (2025.01); *H10D 89/921* (2025.01); *H10D 89/713* (2025.01); *H10D 89/911* (2025.01)

(56) References Cited

U.S. PATENT DOCUMENTS

| | | | |
|---|---|---|---|
| 2005/0195540 A1* | 9/2005 | Streibl | H10D 89/713 361/100 |
| 2007/0002508 A1* | 1/2007 | Vanysacker | H10D 89/713 361/56 |
| 2019/0229112 A1* | 7/2019 | Kutsukake | H10D 8/422 |
| 2020/0051971 A1 | 2/2020 | Yeh et al. | |
| 2021/0203154 A1 | 7/2021 | Delshadpour et al. | |
| 2021/0296305 A1* | 9/2021 | Sai | H10D 89/611 |
| 2022/0294213 A1 | 9/2022 | Gao et al. | |

\* cited by examiner

ELECTROSTATIC DISCHARGE DIODES WITH DIFFERENT SIZES AND METHODS OF MANUFACTURING THEREOF

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
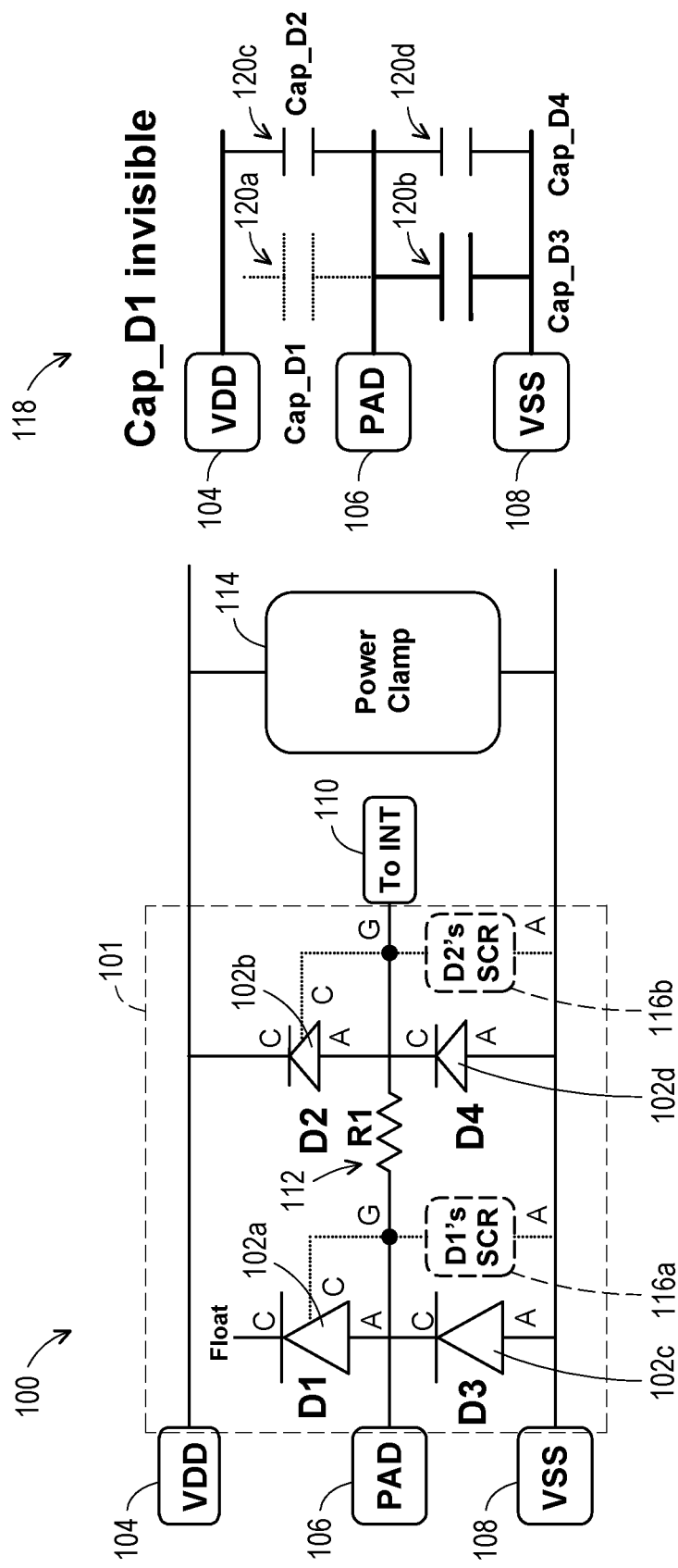
FIG. 1 illustrates diagrams of an example circuit for electrostatic discharge (ESD) protection, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over, or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" "top," "bottom" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In general, semiconductor devices or circuits fabricated via a complementary metal-oxide-semiconductor (CMOS) technology, among other types of fabrication processes, can be designed to meet/satisfy desired reliability specifications. For certain communication interfaces (e.g., advance high-speed interfaces), such as but not limited to a universal serial bus (USB), peripheral component interconnect express (PCIe), Ethernet, etc., it is desired for electrostatic discharge (ESD) protection designs to have a relatively low parasitic capacitance (e.g., of diodes) to reduce or minimize signal loss and smooth out electrical ripples (e.g., having multiple diodes with respective capacitance can increase capacitance distribution, thereby providing localized ripple reduction and improved noise filtering, reduce parasitic inductance and resistance, enhance frequency response, and/or improve voltage regulation) while maintaining or improving protection to the internal circuit (e.g., various electrical components) of the semiconductor device. For example, each diode can include a respective amount or value of capacitance. Higher capacitance diodes may not be desirable for ESD protection circuits because of at least the slower response time (e.g., takes longer to discharge excess energy during ESD events), increased circuit loading (e.g., capacitance interaction with circuit's impedance can cause a reduction in signal integrity, thereby affecting the performance of the circuit), relatively higher parasitic effects (e.g., reduces the effectiveness of the diode in clamping the voltage, while creating additional ringing or oscillations in the circuit), etc. As such relatively lower capacitance diodes are desired for implementing the ESD protection circuit, among other types of circuits, to at least minimize signal loss, such as for signals (e.g., current) flowing to the diodes with relatively high capacitance.

In certain systems, smaller-sized diodes (e.g., sometimes referred to as ESD diodes) may be introduced to decrease the capacitance loading in the circuit. However, simply implementing smaller diodes with lower capacitance may induce a higher clamping voltage during an ESD event, leading to current leakage that may potentially damage or destroy the internal circuit (e.g., internal core circuit or components of the semiconductor device). In this case, although the capacitance is reduced for the circuit, the ESD protection design may not protect the internal circuit during certain ESD events. Hence, the systems and methods of the technical solutions discussed herein can fabricate a semiconductor device using diodes with reduced capacitance without compromising the ESD protection for the internal circuit.

FIG. 1 illustrates diagrams (e.g., schematic diagram 100 and circuit diagram 118) of an example circuit 101 for ESD protection (e.g., ESD protection circuit), in accordance with some embodiments. The schematic diagram 100 includes at least the example circuit 101 coupled to a power clamp 114 for ESD protection. The power clamp 114 can sometimes be referred to as power-rail ESD clamp circuit. The power clamp 114 can be electrically connected/coupled to the circuit 101 in parallel. The power clamp 114 can include or correspond to a circuit configured to divert excess energy (e.g., electricity) from an ESD event away from the protected circuitry (e.g., the internal circuit 110 of the semiconductor device), to prevent the excess energy from reaching and damaging the internal circuit 110. For example, during the ESD event, the power clamp 114 can divert the excess energy to various components of the circuit 101. In some cases, the components of the circuit 101 can be a part of the power clamp 114 configured to provide ESD protection to the internal circuit 110.

As shown, the components of circuit 101 can include but not are not limited to various diodes 102a-d (e.g., sometimes referred to as diode(s) 102), at least one resistor 112, and one or more silicon-controlled rectifier (SCRs) 116a-b (e.g., sometimes referred to as SCR(s) 116). The components of the circuit 101 (e.g., the diodes 102, the resistor 112, or the SCRs 116) can be electrically coupled to at least one power source including VDD 104 (e.g., positive power supply voltage) and VSS 108 (e.g., negative power supply voltage or ground reference), at least one PAD 106, and/or the internal circuit 110 of the semiconductor device.

The PAD 106 can refer to a physical contact area on the integrated circuit (IC) package or die structured to connect the IC or semiconductor device to at least one external component. The internal circuit 110 can include or refer to circuitry or electrical components contained within the semiconductor device. The internal circuit 110 can include any electrical components that enable/allow the semiconductor device to operate or function as intended. The components of the circuit 101 can be structured or configured to prevent current leakage (e.g., excess energy) from accessing or damaging the internal circuit 110.

As shown in FIG. 1, the circuit 101 includes four diodes 102 (e.g., D1-D4) for ESD protection design. Although four diodes 102 are presented, additional or fewer diodes may be implemented to provide ESD protection. Each diode 102 allows current to flow from one direction, such as from an anode (e.g., labeled as "A") to a cathode (e.g., labeled as "C") of the diode 102, while blocking current flow from the other direction (e.g., from the cathode to the anode). The diode 102 can be formed or composed of two types of semiconductor materials, including a P-type (e.g., P-semiconductor material) and an N-type (e.g., N-semiconductor material). The P-semiconductor material can correspond to a positively doped region and the N-semiconductor material can correspond to a negatively doped region of the diode 102. These two types of semiconductor materials are coupled to create a p-n junction at the boundary between the semiconductor materials, thereby forming the diode 102 including an anode terminal and a cathode terminal. The anode terminal of the diode 102 is connected to the P-type semiconductor material and the cathode terminal of the diode 102 is connected to the N-type semiconductor material, such as described in conjunction with but not limited to at least one of FIGS. 4A-C.

To reduce the capacitance of the diodes 102 without compromising the ESD protection of the internal circuit 110, the diodes 102 can be split into at least two sizes (e.g., different capacitance), with the different-sized diodes 102 coupled in parallel with each other. For example, the diodes 102 of the circuit 101 can include D1-D4. D1-D4 can be referred to as a first diode 102a, a second diode 102b, a third diode 102c, and a fourth diode 102d, respectively. Each diode 102 can include respective anode and cathode. For instance, the first diode 102a includes a first cathode and a first anode, the second diode 102b includes a second cathode and a second anode, the third diode 102c includes a third cathode and a third anode, and the fourth diode 102d includes a fourth cathode and a fourth anode. These diodes 102 can be electrically coupled/connected to each other to provide multiple current flow paths to and/or away from (e.g., via D1 and/or D2) the internal circuit 110, such as to prevent excess current or current leakage from accessing the internal circuit 110.

The size of the diode 102 can refer to its capacitance. As shown, the first diode 102a and the third diode 102c can be formed or structured with higher capacitance (e.g., bigger size) compared to the second diode 102b and the fourth diode 102d. For example, the first diode 102a includes a first size, the second diode 102b includes a second size, the third diode 102c includes a third size, and the fourth diode 102d includes a fourth size. The first size can be (e.g., substantially) greater than the second size. The third size can be (e.g., substantially) greater than the fourth size. For simplicity and for purposes of providing examples herein, the first size and the third size may be the same size (or around the same), and the second size and the fourth size may be the same size (or around the same). In such cases, the size of D1 and D3 can be substantially greater than the size of D2 and D4, for example. In some other cases, the first size may be different from the third size and/or the second size may be different from the fourth size.

In some cases, the size of the diode 102 can be measured according to or based on its overlapped-depleted (OD) region. For example, the OD region ratio between the first size of the first diode 102a and the second size of the second diode 102b can be at least from 9.5:0.5 to 7:3, among other values. The reference silicon between the first diode 102a and the second diode 102b can be 8.5:1.5, among other values according to the specification.

To form an ESD protection for the circuit 101, the various diodes 102 can be connected to each other for allowing excess current to flow away from the internal circuit 110 as follows. The first cathode of the first diode 102a can be floating (e.g., not connected to other portions of the circuit 101). The first anode of the first diode 102a can be electrically coupled to the second diode 102b via the second anode, where the second cathode of the second diode 102b can be coupled to the VDD 104 (e.g., a first supply voltage or power source). In this configuration, the first diode 102a can be coupled to the second diode 102b via the resistor 112. The first anode can also be coupled/connected to the third cathode of the third diode 102c at the PAD 106 (e.g., input/output pin/port for connection to external component). The third anode of the third diode 102c can be connected to the VSS 108 (e.g., a second supply voltage or power source). Similarly to the first diode 102a and the third diode 102c, the second anode of the second diode 102b can be coupled to the fourth cathode of the fourth diode 102d. The fourth anode of the fourth diode 102d can be connected to the VSS 108 and the third anode of the third diode 102c. The first diode 102a can have the first size substantially greater than the second size of the second diode 102b.

In various configurations, the first anode and the third cathode (e.g., via the resistor 112), and the second anode and the fourth cathode can be connected to the internal circuit 110, such that current can flow to the internal circuit 110 without potential excess energy or current leakage. For example, the first diode 102a and the third diode 102c can form a first discharge path. The second diode 102b and the fourth diode 102d can form a second discharge path. Additional discharge paths may be provided by forming or implementing additional diodes 102, for example. Hence, by providing these discharge paths, the circuit 101 can prevent the discharged current during ESD events from flowing to the internal circuit 110. The design of the circuit 101 can allow the decrease in capacitance, such as by at least 30% compared to certain other devices, without compromising the ESD protection.

One or more SCRs 116 can be formed or implemented in circuit 101 to provide one or more discharge paths during ESD events. Although the first cathode of the first diode 102a is floating (e.g., potentially decreasing the ESD discharge path), the one or more SCRs 116 can be embedded for respective one or more diodes 102 to conduct ESD current during an ESD event. Each SCR 116 is a three-terminal device consisting of four semiconductor layers (e.g., four-layer solid-state device), including the P-N-P-N layers. The three terminals include an anode, a cathode, and a gate (e.g., labeled as "G"), each formed at the respective junction of the P-N-P-N layers (e.g., three p-n junctions). the SCR 116 may operate similarly to a rectifier, allowing the current to flow from one direction, e.g., from anode to cathode. During operation, the SCR 116 may operate as an open circuit until a trigger voltage (or breakdown voltage) is applied or received by the SCR 116. The trigger voltage can be predetermined according to the specification of the semiconductor device, as to prevent damage to the internal circuit 110, for example. The trigger voltage can be applied when current (e.g., excess current) flow via/through the resistor 112, leading to a voltage drop across the resistor 112. The resistor 112 implemented in the circuit 101 can include a predetermined resistance according to the specification, such as between 0.1 ohm to 0.5 ohm, among other values. When the trigger voltage is applied between the anode and the cathode (e.g., at the gate terminal) of the SCR 116, the SCR 116 can enter a conducting state, thereby forming a (e.g., discharge) path allowing current to flow from the anode to the cathode. Hence, during ESD events, the voltage from the ESD event may trigger the SCR 116 to enter the conducting state, such that excess current can flow via the discharge path instead of to the internal circuit 110, preventing potential damages.

As shown in FIG. 1, the circuit 101 can include a first SCR 116a and a second SCR 116b. The anode of the first SCR 116a can be connected to the VSS 108. The gate of the first SCR 116a can be coupled to the first anode of the first diode 102a. The cathode of the first SCR 116a can be coupled to the first cathode of the first diode 102a. The anode of the second SCR 116b can be connected to the VSS 108. The gate of the second SCR 116b can be coupled to the second anode of the second diode 102b. The cathode of the second SCR 116b can be coupled to the second cathode of the second diode 102b. The first SCR 116a and the second SCR 116b can be triggered based on the voltage applied at their respective gate. The trigger voltage for the second SCR 116b can be lower than the trigger voltage for the first SCR 116a because the capacitance associated with the second diode 102b is less than the first diode 102a, where the semiconductor materials of the respective diode 102 are used in part to form the respective SCR 116. In this case, the second SCR 116b can be triggered before the first SCR 116a. The formation and/or operation of the SCR 116 can be described in conjunction with at least FIGS. 5-6D. By implementing the diodes 102 with lower capacitance and the SCRs 116 according to the layout of at least FIG. 1, the overall capacitance of the ESD protection circuit (e.g., circuit 101) and the voltage clamp can be reduced/minimized compared to certain other systems.

The circuit diagram 118 can correspond to the schematic diagram 100, including various components of at least circuit 101. The circuit diagram 118 can include capacitors 120a-d (e.g., sometimes referred to as capacitor(s) 120) representing the amount of capacitance for the respective diodes 102. For example, the first capacitor 120a can include a first capacitance corresponding to the capacitance of the first diode 102a. The second capacitor 120b can include a second capacitance corresponding to the capacitance of the second diode 102b. The third capacitor 120c can include a third capacitance corresponding to the capacitance of the third diode 102c. The fourth capacitor 120d can include a fourth capacitance corresponding to the capacitance of the fourth diode 102d. The first capacitor 120a (e.g., the capacitance of the first diode 102a) may be invisible because the first cathode is floating, for example.

Figure 2:
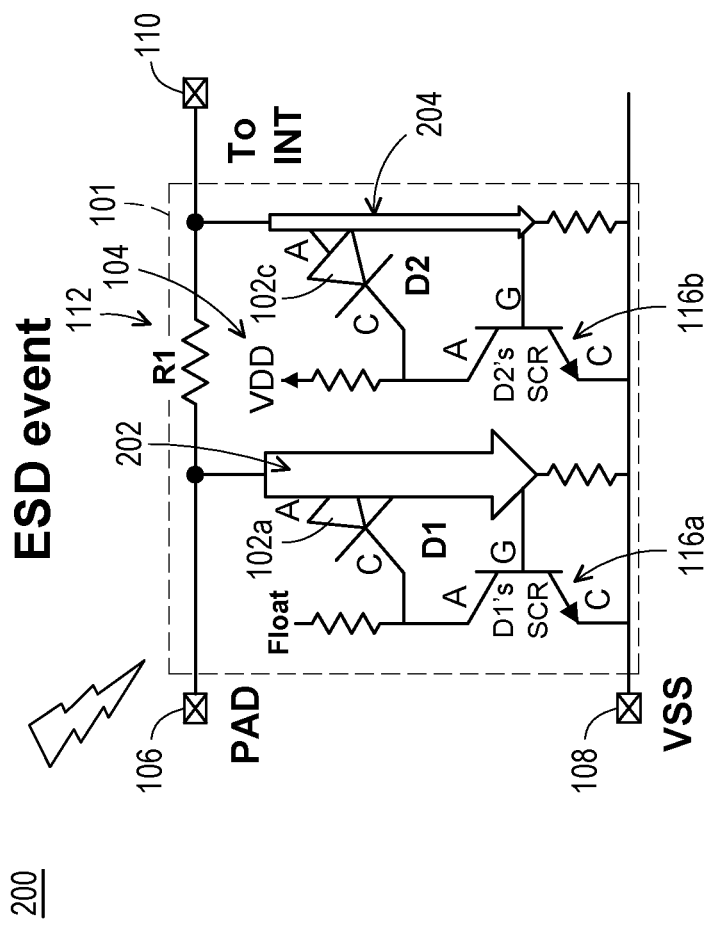
FIG. 2 illustrates example electrical paths within the example circuit of FIG. 1 during an ESD event, in accordance with some embodiments.

FIG. 2 shows example electrical paths within the example circuit 101 of FIG. 1 during an ESD event, in accordance with some embodiments. Schematic diagram 200 shows various components of the circuit 101 including at least the diodes 102, the power sources (e.g., VDD 104 and VSS 108), the PAD 106 (e.g., input/output pin), the path to the internal circuit 110, the resistor 112, and the SCRs 116. The arrangements or couplings of these components can be similar to those shown in FIG. 1. For instance, the first cathode can be floating, the first anode can be coupled/connected to the second anode, the second cathode can be connected to the VDD 104, the first SCR 116a can be associated with the first diode 102a, the second SCR 116b can be associated with the second diode 102b, etc.

During the ESD event, excess current may traverse/flow from the PAD 106 (e.g., input/output pin) to various components of the circuit 101. The excess current may flow through the resistor 112, where the voltages applied at the terminals of the resistor 112 can correspond to the voltages applied at the gates of the SCRs 116. In this case, the voltage applied due to the excess current can trigger the SCRs 116 to enable respective discharge paths, including a first discharge path from the anode to the cathode of the first SCR 116a and a second discharge path from the anode to the cathode of the second SCR 116b. The second SCR 116b may enable its discharge path before the first SCR 116a. Responsive to providing the discharge paths, at least a portion of the excess current (e.g., current flow 204) can flow through the second discharge path, and another portion of the excess current (e.g., current flow 202) can flow through the first discharge path, such as from the PAD 106 (e.g., input/output pin) to the VSS 108 (e.g., second supply voltage), directed away from the internal circuit 110 to prevent damage to other electrical components.

Figure 3:
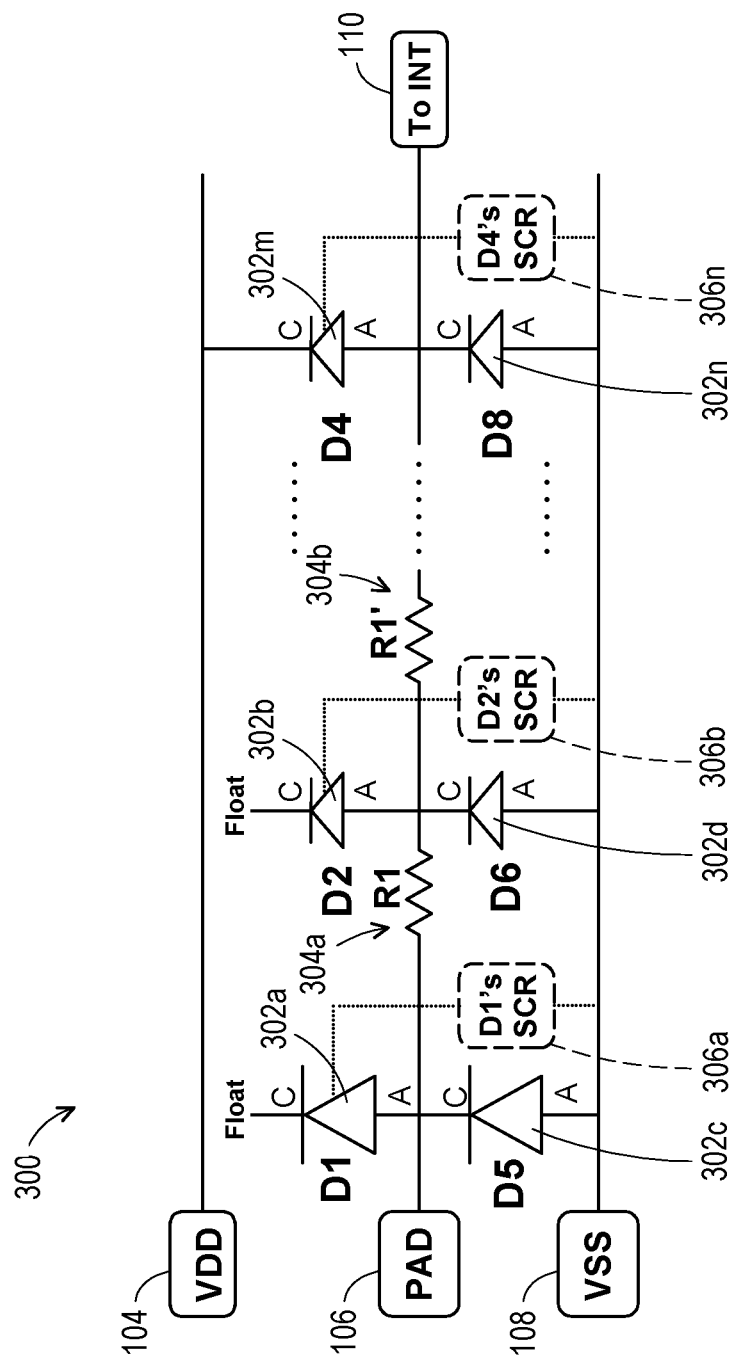
FIG. 3 illustrates another example circuit for ESD protection similar to the example circuit of FIG. 1, in accordance with some embodiments.

FIG. 3 illustrates another example circuit 300 for ESD protection similar to the example circuit of FIG. 1, in accordance with some embodiments. The example circuit 300 can include components similar to the example circuit 101. For example, the circuit 300 can include various diodes 302a-n (e.g., sometimes referred to as diode(s) 302), the power sources (e.g., VDD 104 and VSS 108), the PAD 106, the path to the internal circuit 110, various resistors 304a-b (e.g., sometimes referred to as resistor(s) 304), and various SCRs 306a-n (e.g., sometimes referred to as SCR(s) 306).

The diodes 302 can correspond to or be similar to the diodes 102, for instance, including similar features or functionalities. The resistors 304 can correspond to or be similar to the resistor 112. The resistors 304 may include similar or different resistance to each other. The SCRs 306 can correspond to or be similar to the SCRs 116.

In some implementations, the circuit 300 for ESD protection may include more than four diodes, such as eight diodes (e.g., D1-D8, respectively) in this case. The arrangements of the components of the circuit 300 can be similar to the circuit 101. For example, the anodes of D1-D4 can be coupled to each other. The cathodes of D1-D3 can be floating, and the cathode of D4 (e.g., similar to the second cathode of the second diode 102b) can be connected to the VDD 104 (e.g., the first supply voltage). In some cases, at least one other cathode of at least one of D1-D3 may be connected to the VDD 104. The cathodes of D5-D8 can be coupled to the anodes of D1-D4, respectively. The anodes of D5-D8 can be connected to the VSS 108 (e.g., the second supply voltage). The size (e.g., capacitance) of D1 and D5 may be substantially larger than other diodes 302, including at least one of D2-D4 and/or D6-D8 (e.g., second size). For purposes of providing examples, D1 and D5 can include the first size, and D2-D4 and D6-D8 can include the second size, although these diodes 302 may be configured with different sizes. The SCRs 306 can be associated with or coupled to the respective diodes 302, such as SCR 306a-n coupled to D1-Dn, respectively.

In some other configurations, more or less diodes 302 and/or SCRs 306 can be implemented for ESD protection circuits. For example, additional diodes 302 may be implemented with a size substantially smaller than the first size. In some cases, additional diodes 302 may be implemented with a size greater than or similar to the first size.

Figure 4A:
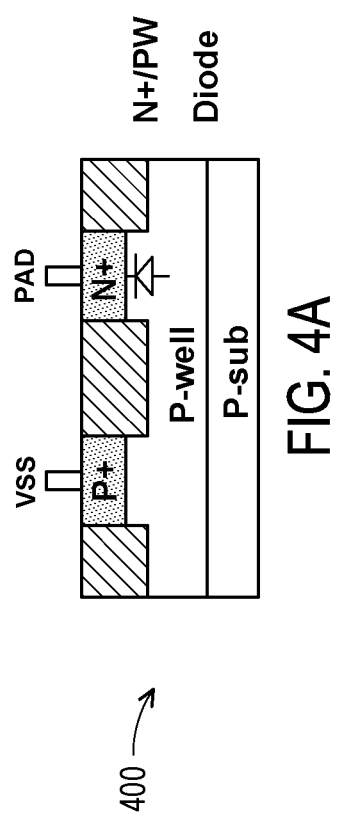
FIGS. 4A-C illustrate example structures to form diodes implemented in the example circuit of FIG. 1, in accordance with some embodiments.
Figure 4B:
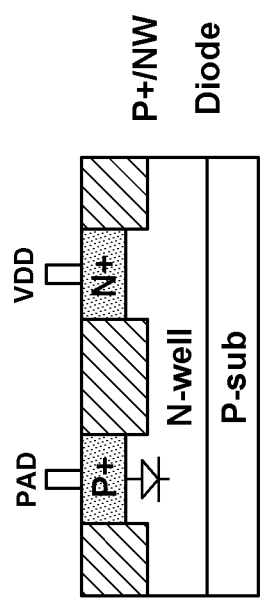
Figure 4C:
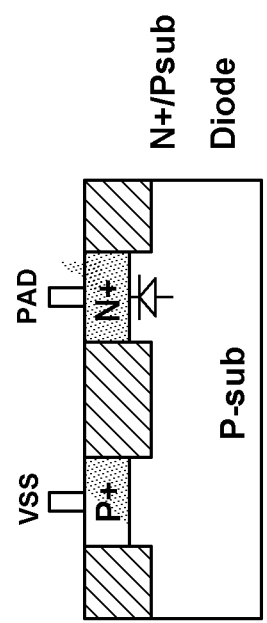

FIGS. 4A-C illustrate example structures 400-404 to form diodes (e.g., diodes 102) implemented in the example circuit 101 of FIG. 1, in accordance with some embodiments. The structures 400-404 of FIGS. 4A-C can represent cross-sectional views of the diodes 102, showing various layers that form the diode 102. For example, the formation of each diode 102 can involve the construction of a p-n junction between two different types of semiconductor materials, such as P-type (e.g., positively doped) and N-type (e.g., negatively doped) regions. The semiconductor materials can be composed of but not limited to at least one of silicon, germanium, gallium nitride, etc. The semiconductor material may be positively doped to form the P-type region, or negatively doped to form the N-type region. The terminals (e.g., anode and cathode) of the diode 102 can correspond to the P-type region and the N-type region respectively.

The structure 400 can be fabricated to form an N+/PW diode. For example, a P-type substrate (Psub) can be deposited as the base (or the first) layer. The P-type substrate may refer to a substrate having a first conductivity (e.g., P-type). P-type semiconductor material (e.g., P-well) can be formed above the P-type substrate. Further, P-type region (P+) and N-type region (N+) (e.g., respectively positively doped and negatively doped semiconductor materials) can be formed above the P-well (PW), separated by at least one isolation layer or material, such as silicon dioxide, silicon nitride, shallow trench isolation, etc. In this case, the p-n junction can form between the P-well and the N-type region, thereby forming the N+/PW diode. The N+/PW diode can correspond to at least one of the third diode 102c and/or the fourth diode 102d.

The structure 402 can be fabricated to form a P+/PW diode. For example, similar to the structure 400, the P-type substrate can be formed as the base layer and the P-type and N-type regions can be formed above the well layer or region. Instead of the P-well, the structure 402 can be formed using the N-well (NW), thereby forming a p-n junction between the P-type region and the N-well layer to form the P+/PW diode. The P+/PW diode can correspond to at least one of the first diode 102a (e.g., if the first cathode is floating) or the second diode 102b.

The structure 404 can be fabricated to form an N+/Psub diode. In this case, the well layer (e.g., N-well or P-well) may not be deposited or formed above the P-type substrate. As such, a p-n junction can be formed between the N-type region and the P-type substrate to form the N+/Psub diode. The N+/Psub diode can correspond to at least one of the third diode 102c and/or the fourth diode 102d, similar to the structure 400. In some configurations, the substrate may be fabricated as an N-type substrate. Although not described, various etching, masking, or other fabrication processes can be performed to form the diode 102 of structures 400-404 or other components discussed herein.

Figure 5:
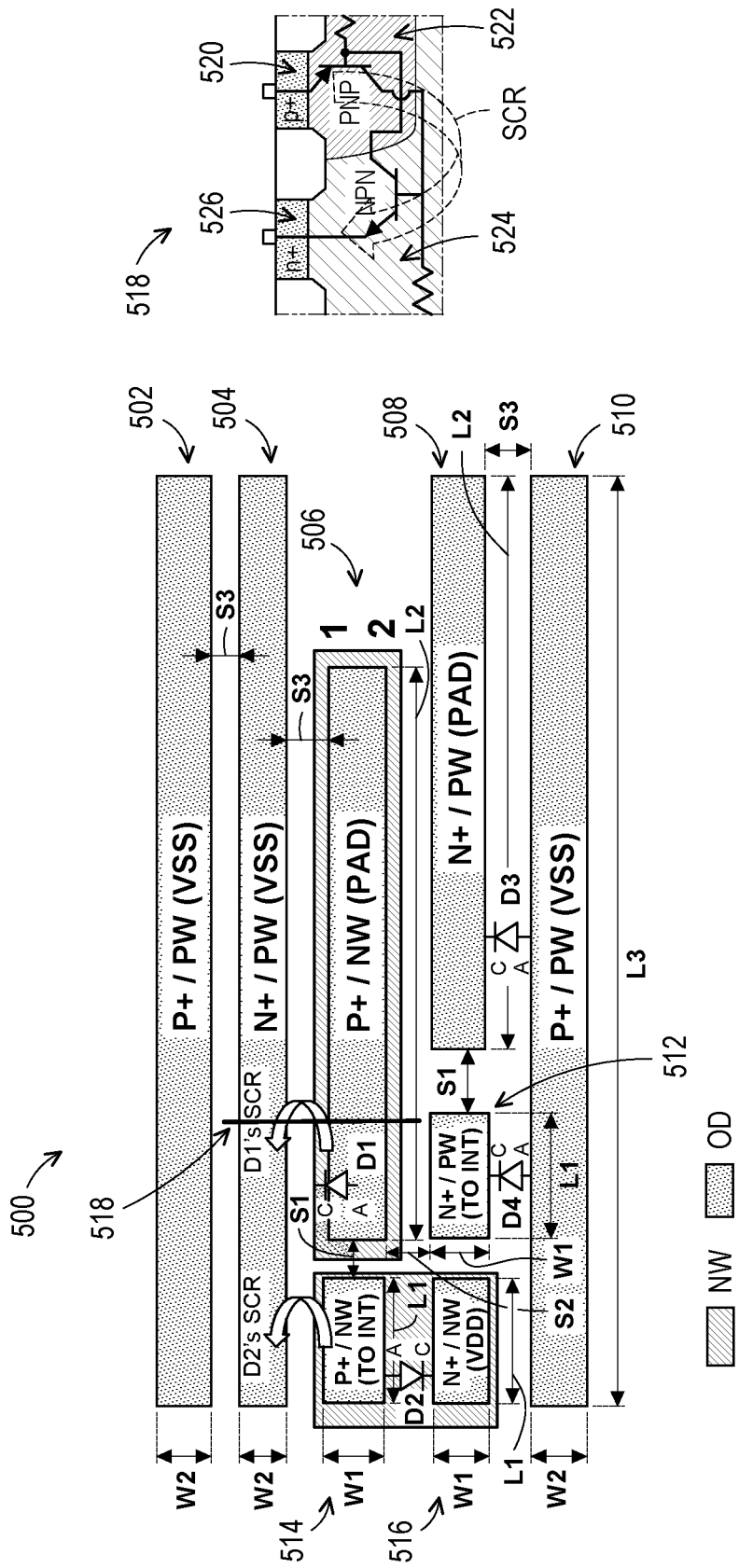
FIG. 5 illustrates an example layout of the example circuit of FIG. 1, in accordance with some embodiments.
Figure 6A:
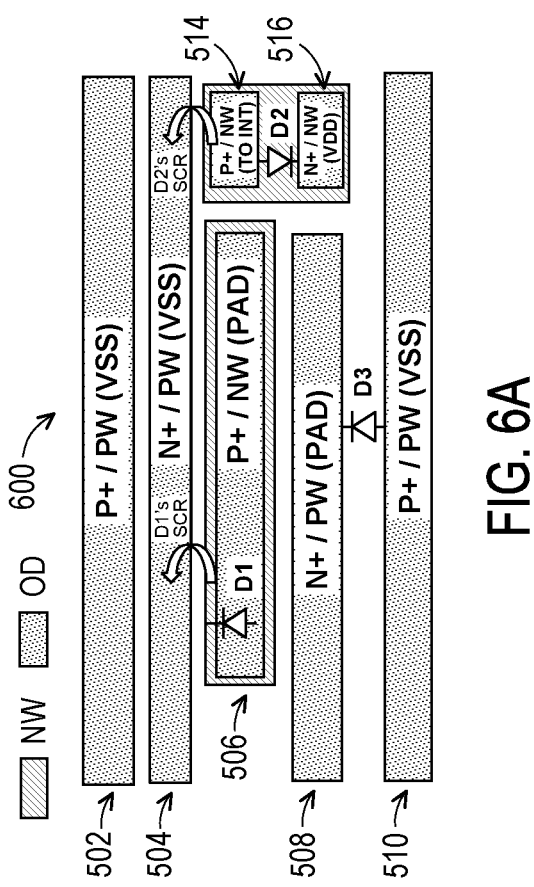
FIGS. 6A-D illustrate example positionings of the N-well associated with the example layout of FIG. 5, in accordance with some embodiments.
Figure 6B:
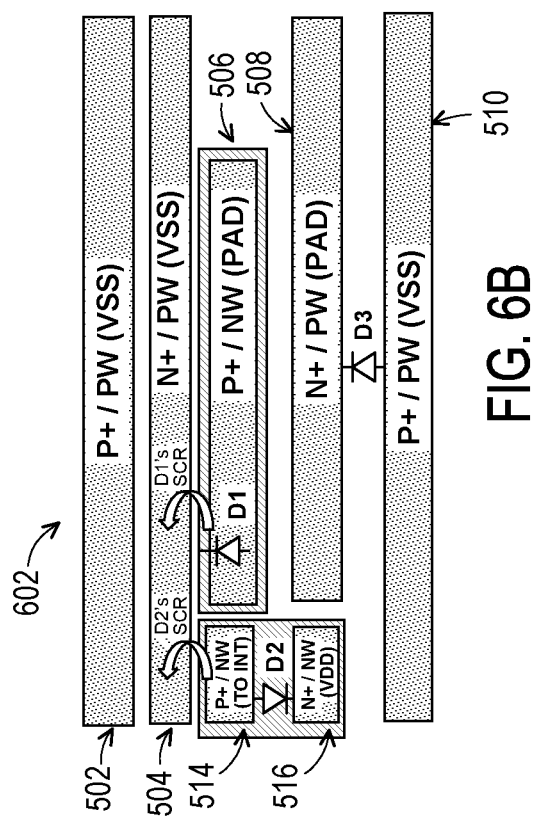
Figure 6C:
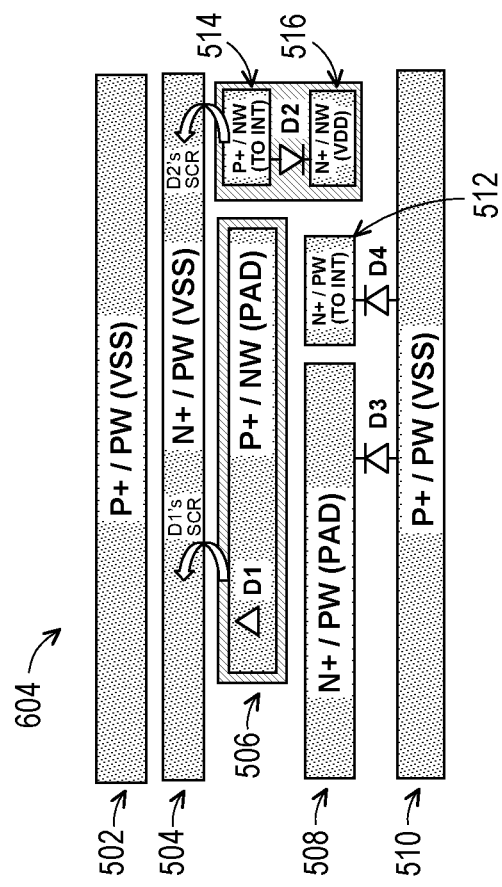
Figure 6D:
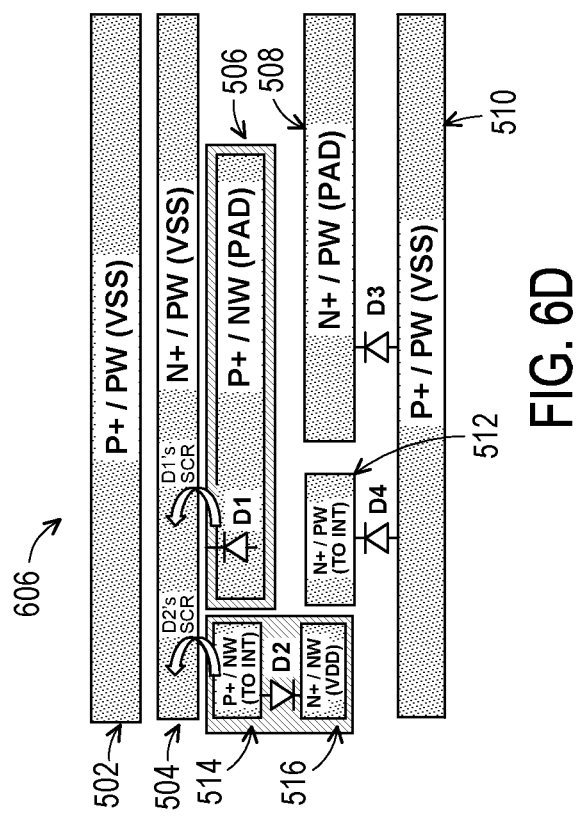

FIG. 5 illustrates an example layout 500 of the example circuit 101 of FIG. 1, in accordance with some embodiments. The example layout 500 can correspond to or represent a top view of semiconductor materials fabricated to form at least a portion of the components of circuit 101. The example layout 500 can include various structures 502-516 forming the semiconductor device. The structures 502-516 may be fabricated or formed above, within, or over a base substrate (e.g., a substrate having a first conductivity, such as P-type). For example, structure 502 can include an OD region (e.g., contact region) formed to contact or connect with the VSS (e.g., VSS 108 or the second supply voltage). The OD region of structure 502 can be composed of at least a P-type semiconductor material. This OD region may be disposed above, within, or over a P-well layer. Structure 504 can include an OD region connected to the VSS. The structure 504 can be composed of at least an N-type semiconductor material disposed above a P-well layer. Structure 506 can include an OD region composed of P-type semiconductor material. This OD region can be disposed above an N-well layer (e.g., a first well enclosed by the substrate and having a second conductivity, such as N-type), thereby forming a p-n junction (e.g., first contact region enclosed by the first well and having the first conductivity) for the diode 102. The p-n junction formed by the structure 506 can be associated with D1 (e.g., the first diode 102a of circuit 101).

In further examples, structure 508 can include an OD region composed of N-type semiconductor material disposed above a P-well layer. The OD regions of the structures 506, 508 can be connected to the input/output pin (e.g., the PAD 106). Structure 510, similarly to the structure 502, can include an OD region composed of P-type semiconductor material disposed above a P-well layer. The structures 508, 510 can be (e.g., electrically) coupled to form a p-n junction. In this case, the p-n junction between the structures 508, 510 can be associated with D3 (e.g., the third diode 102c of circuit 101). Structure 512 can include an OD region composed of N-type semiconductor material disposed above a P-well layer. This OD region can be connected to the internal circuit 110. In this case, the structure 510 can be coupled with the structure 512 to form a p-n junction associated with D4 (e.g., the fourth diode 102d of circuit 101). The structures 514, 516 can include respective OD regions composed of P-type and N-type semiconductor materials, respectively, disposed over an N-well layer (e.g., a second well enclosed by the substrate and having the second conductivity, such as N-type). The OD region of structure 514 can be connected to the internal circuit 110. The OD region of structure 516 can be connected to the VDD (e.g., the VDD 104 or the first supply voltage). The structures 514, 516 can form the p-n junction associated with D2 (e.g., the second diode 102b). For instance, the structure 514 can form a second contact region enclosed by the second well and having the first conductivity. The structure 516 can form a third contact region enclosed by the second well and having the second conductivity. The second contact region and the second well with the third contact region can form the a diode 102 (e.g., the second diode 102b). Although one OD region is shown for each of the structures 502-516 of the example layout 500, multiple OD regions (e.g., multiple parallel ODs) can be implemented for at least one of the structures 502-516.

In some implementations, the structure 504 can form a fourth contact region enclosed by the substrate, disposed on a first lateral side (e.g., above, in relation to the top view) of the first and second wells (e.g., N-type wells of the structures 506, 514, 516), and having the second conductivity. The structure 510 can form a fifth contact region enclosed by the substrate, disposed opposite the fourth contact region from the first and second wells (e.g., below the structures 508, 512, 516), and having the first conductivity (e.g., P-type). The structure 508 can form a sixth contact region enclosed by the substrate, disposed on a second lateral side (e.g., below, in relation to the top view) of the first well, and having the second conductivity. The structure 510 may form a seventh contact region enclosed by the substrate, disposed opposite the sixth contact region from the first well, and having the first conductivity.

In some implementations, an SCR can be formed between P-type and N-type structures, such as when there are P-N-P-N layers (e.g., P+, N-type layer, P-type layer, and N+). For example, an example cross-sectional view 518 of the structures 504, 508 can be shown. The cross-sectional view 518 includes at least a P-type region (P+) 520, a P-type layer 522 (e.g., P-well or P-substrate), an N-type layer 524 (e.g., N-well or N-substrate, in some cases), and an N-type region (N+) 526. These regions and/or layers can form the P-N-P-N layers including three junctions to form the SCR, such as the first SCR 116a of D1 between the structures 504, 506. Similarly, the second SCR 116b of D2 can be formed between the structures 504, 514.

The dimensions of the structures 502-516 can be predetermined or configured for fabricating the semiconductor device (or circuit 101). For example, the length of the structures 512-516 can be less than or equal to 10 μm. The length of the structures 506-508 can be less than or equal to 30 μm. The length of the structures 502-504, 510 can be less than or equal to 40 μm. The width of the structures 502-516 can be less than or equal to 0.9 μm. The space or gap between the structure 506 and the structure 514, between the structure 512 and the structure 516, and between the structure 508 and the structure 512 can be less than or equal to 2 μm. The space between each of structures 508, 512, 516 and each of structures 506, 514 can be less than or equal to 0.6 μm. The space between the structure 502 and the structure 504, between the structure 504 and each of structures 506, 514, and between the structure 510 and each of structures 508, 512, 516 can be less than or equal to 0.75 μm. Other dimensions can be used for the width, length, height, and/or space of/between the structures 502-516, among other structures of the semiconductor device.

FIGS. 6A-D illustrate example positionings of the N-well associated with the example layout of FIG. 5, in accordance with some embodiments. In example layouts 600, 602, the structure 512 (e.g., used to form D4 or the fourth diode 102d) can be removed from the circuit 101. Hence the fourth diode 102d may not be included in the circuit 101 with the example layouts 600, 602. In the example layout 600, the structures 514, 516 associated with the N-well can be positioned to the right of the structures 506, 508. In the example layout 602, the structures 514, 516 associated with the N-well can be positioned to the left of the structures 506, 508.

In example layouts 604, 606, the structure 512 can be included in the circuit 101 to form the fourth diode 102d, for example. Similar to the example layout 600, the example layout 604 can include the structures 514, 516 positioned to the right of the structures 506, 508, 512. Similar to the example layout 602, the example layout 606 can include the structures 514, 516 positioned to the left of the structures 506, 508, 512. In some cases, the length of structure 508 of example layouts 600, 602 can be relatively longer than the length of structure 508 from the example layouts 604, 606 because the structure 512 is not included. In some other cases, the length of structure 508 can be the same for the example layouts 600-606. The positioning of the N-well region may be changed to other portions of the circuit layout, not limited to those described herein.

Figure 7A:
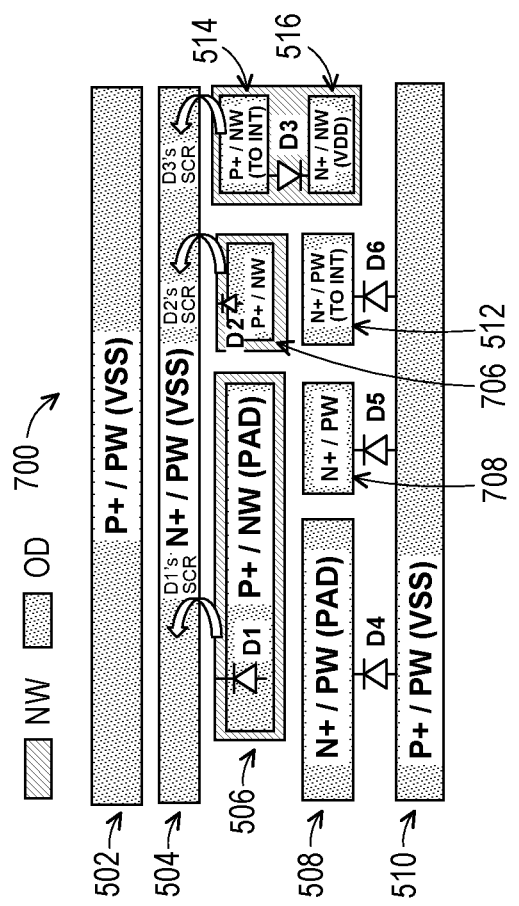
FIGS. 7A-C illustrate example layouts of an example circuit with six diodes for ESD protection, similar to the example circuit of FIG. 1, in accordance with some embodiments.
Figure 7B:
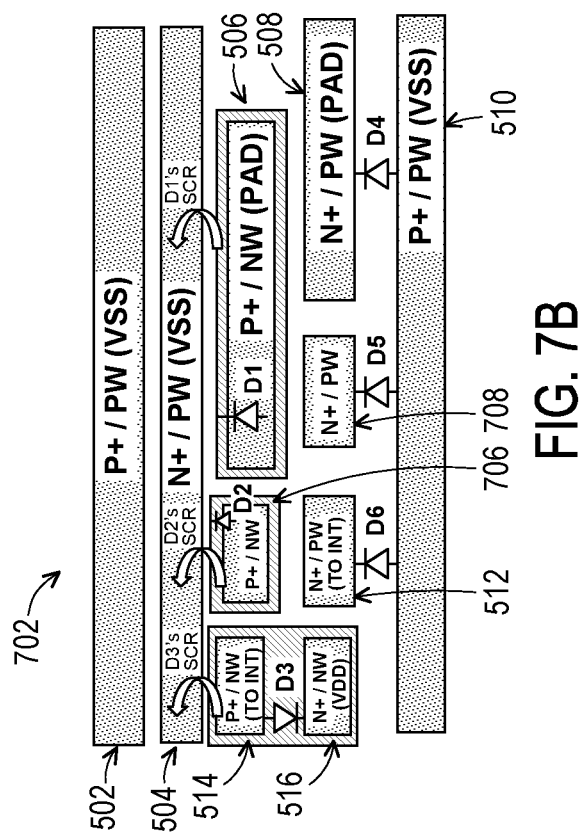
Figure 7C:
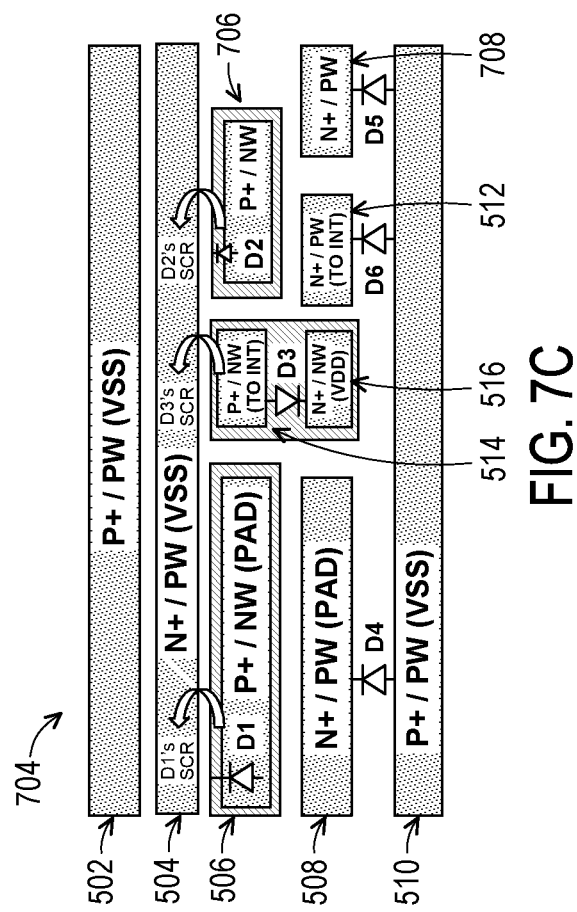

FIGS. 7A-C illustrate example layouts 700-704 of an example circuit with six diodes (e.g., D1-D6) for ESD protection, similar to the example circuit 101 of FIG. 1, in accordance with some embodiments. The example layouts 700-704 may include similar structures as the example layouts of at least one of FIGS. 5-6D, such as structures 502-516. In the example layouts 700-704, the structures 514, 516 forming the p-n junction can be associated with D3 (e.g., a third diode of the six diodes circuit). The p-n junction between the structures 508, 510 can form D4 of the six diodes circuit. The p-n junction between the structures 510, 512 can form D6 of the six diodes circuit.

The example layouts 700-704 can include additional structures to form additional diodes (e.g., a total of six diodes 102 in this case), including at least structures 706, 708. For example, the structure 706 can include an OD region composed of P-type semiconductor material disposed above, within, or over an N-well. The P-type semiconductor material and the N-well can form a p-n junction, thereby forming a diode. In this case, the p-n junction of the structure 706 can form D2 of the six diodes circuit. The structure 708 can include an OD region composed of N-type semiconductor material disposed above a P-well (or P-substrate). The p-n junction between the P-type material of structure 510 and N-type material of structure 708 can form D5 of the six diodes circuit.

Similar to the example layout 500, the example layouts 700-704 can include SCRs formed between the structures 504, 506 (e.g., SCR associated with D1), and between the structures 514, 504 (e.g., SCR associated with D3). Further, the example layouts 700-704 can include an additional SCR associated with D2. This SCR can be formed between P-type and N-type structures of the structures 504, 706.

The positions of one or more structures of the example circuit can be re-arrange or configured, such as shown but not limited to the example layouts 700-704. For example, in the example layout 700, the structures 512, 706, 708 can be positioned between the structures 506, 508, 514, 516. The structures 506, 508 can be positioned to the left of the structures 512, 706, 708. The structures 514, 516 (e.g., N-well) can be positioned to the right of the structures 512, 706, 708. The structure 708 can be positioned to the left of the structure 512.

In another example, in the example layout 702, the positions of the structures 506, 508, 512-516, 706, 708 can be swapped laterally. As shown, the structures 506, 508 can be positioned to the right of the structures 512, 706, 708. The structures 514, 516 can be positioned to the left of the structures 512, 706, 708. The structure 708 can be positioned to the right of the structure 512. In further examples, in the example layout 704, the structures 506, 508 can be re-arranged or moved to the left side of the structures 512-516, 706, 708 as positioned in the example layout 702. Hence, as shown, the structures 514, 516 can be positioned between the structures 506, 508 (e.g., to the left) and the structures 512, 706, 708 (e.g., to the right). Other arrangements of the structures can be applied similarly to form the circuit 101, the six diodes circuit, among other circuits for ESD protection.

Figure 8:
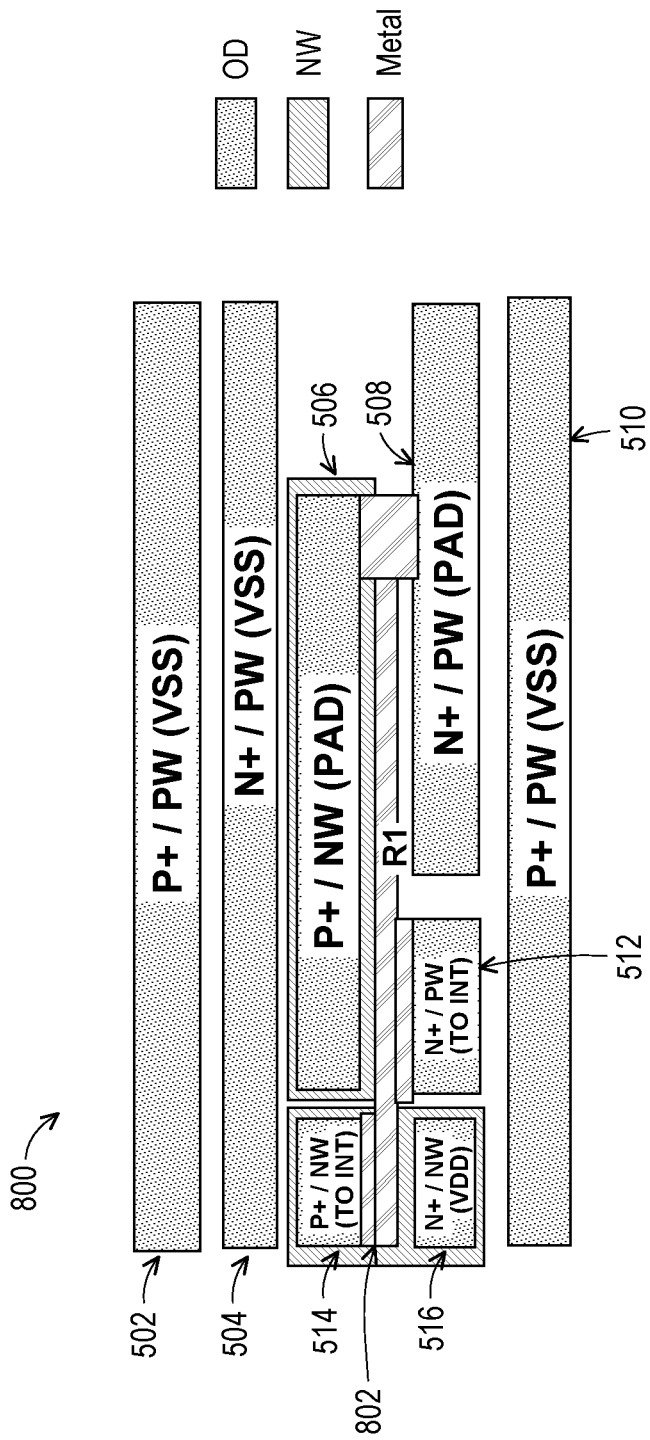
FIG. 8 illustrates an example layout for the positioning of a resistor of the example circuit of FIG. 1, in accordance with some embodiments.

FIG. 8 illustrates an example layout 800 for the positioning of the resistor 112 of the example circuit of FIG. 1, in accordance with some embodiments. The example layout 800 can include various structures (e.g., structures 502-516) and arrangements similar to the example layouts 500, 606, such as described in conjunction with but not limited to at least FIGS. 5-6D. In this case, the example layout 800 can include a metal structure 802 corresponding to the resistor 112 of circuit 101. The metal structure 802 can be coupled to at least one structure corresponding to or associated with a terminal of a diode 102.

For example, the metal structure 802 can be coupled to the P-type material of structure 506, which can correspond to the first anode of the first diode 102*a*. The metal structure 802 can be coupled to the P-type material of structure 514, which can correspond to the second anode of the second diode 102*b*. The metal structure 802 can be coupled to the N-type material of structure 508, which can correspond to the third cathode of the third diode 102*c*. The metal structure 802 can be coupled to the N-type material of structure 512, which can correspond to the fourth cathode of the fourth diode 102*d*. Hence, the first anode, the second anode, the third cathode, and the fourth cathode may be electrically connected via the metal structure 802 (e.g., the resistor 112).

In some implementations, the metal structure 802 of the resistor 112 can be composed of a different material from a metal structure coupling the resistor 112 to one or more structures within the circuit 101. In some other implementations, the metal structure 802 of the resistor 112 can be composed of the same material as the metal structure coupling the resistor 112 to one or more structures within the circuit 101. In some arrangements, the various structures 502-516 of the circuit 101 can be formed within one layer of the semiconductor device. In some other arrangements, the various structures 502-516 of the circuit 101 can be formed on multiple layers of the semiconductor device. The structures 502-516 can be included in a front-end-of-line (FEOL) fabrication process (e.g., initial fabrication stages) or within the substrate. The metal structure 802 can be included in a back-end-of-line (BEOL) fabrication process (e.g., later fabrication stages) for interconnections between various layers or structures. The metal structure 802 forming the resistor 112 can be fabricated in other layers of the semiconductor device different from the layer of the structures 502-516. In some cases, the metal structure 802 may be fabricated in the same layer as the structures 502-516. The metal structure 802 can be connected to one or more structures, such as structures 506, 508, 512, 514 through respective via structures.

Figure 9A:
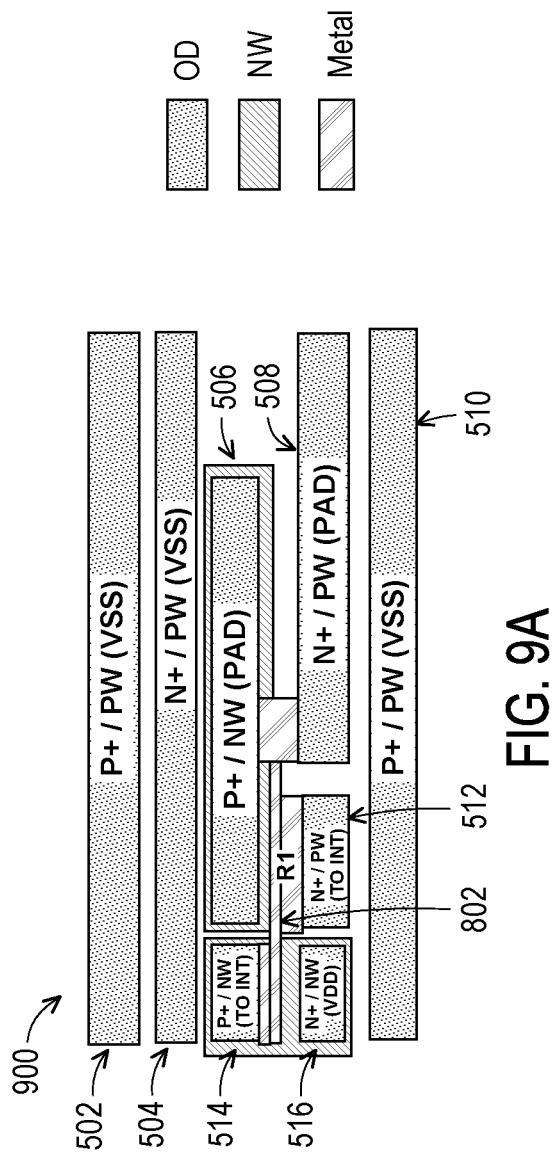
FIGS. 9A-C illustrate example layouts of the resistor for the example circuit of FIG. 1, in accordance with some embodiments.
Figure 9B:
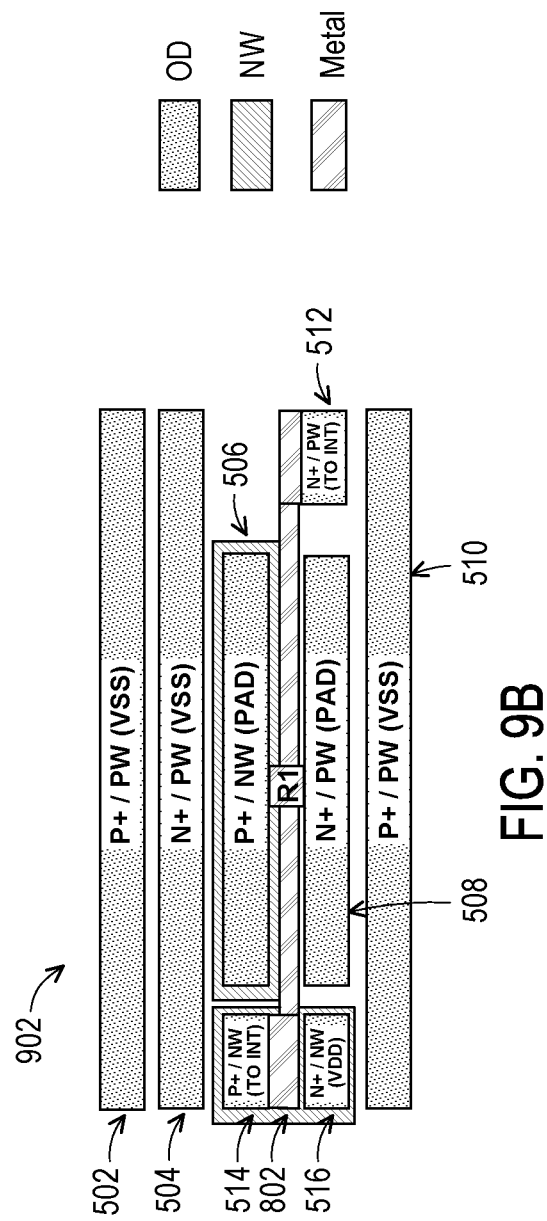
Figure 9C:
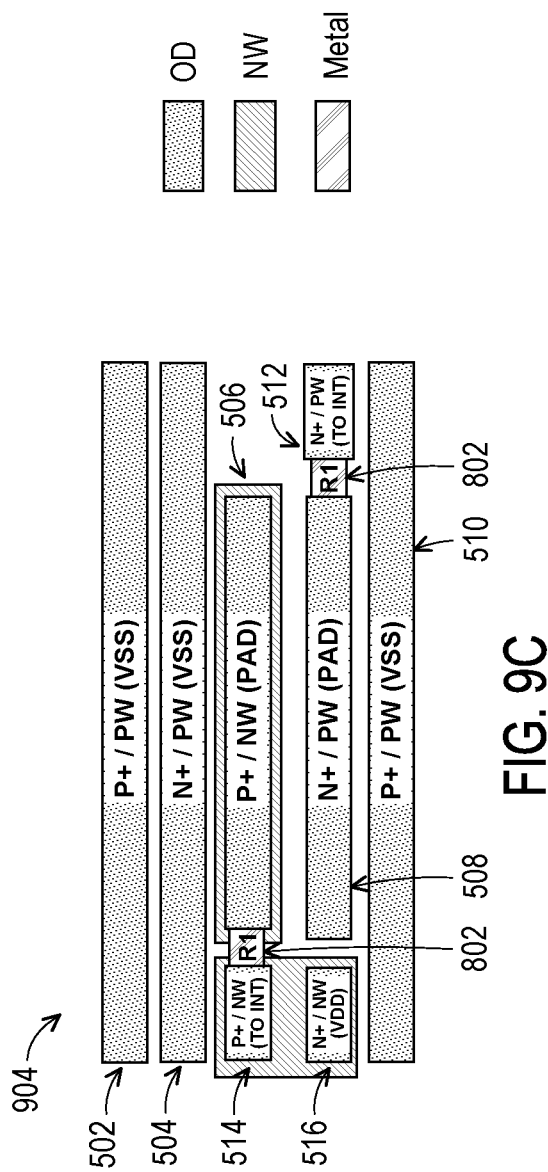

FIGS. 9A-C illustrate example layouts 900-904 of the resistor 112 for the example circuit 101 of FIG. 1, in accordance with some embodiments. The example layouts 900-904 can provide example positions of the metal structure 802 corresponding to the resistor 112 to form connections between the diodes 102 (e.g., between the first to fourth diodes 102*a-d*). For example, the example layout 900 can include the structures 502-516 arranged similarly to the example layout 800. Compared to the example layout 800, the metal structure 802 of the example layout 900 can be reduced while maintaining the connections with at least structures 506, 508, 512, 514 associated with respective terminals of the diodes 102.

In another example, in the example layout 902, the structure 512 can be moved or formed to the right of the structure 508. As shown in this case, the length of the metal structure 802 can be extended for coupling with the structures 506, 508, 512, 514. In further examples, the example layout 904 can include the structures 502-516 positioned similarly to the example layout 902. In this case, the metal structure 802 can be split into two parts formed between a first pair of structures 506, 514 (e.g., corresponding to the first and second diodes 102*a-b*), and a second pair of structures 508, 512 (e.g., corresponding to the third and fourth diodes 102*c-d*). As such, the first and second diodes 102*a-b* can be connected via the resistor 112. The third and fourth diodes 102*c-d* can be connected via the resistor 112 (or a second resistor). The first and second diodes 102*a-b* may not be connected to the third and fourth diodes 102*c-d* via the resistor 112. Although the first and second diodes 102*a-b* may not be connected to the third and fourth diodes 102*c-d* via the resistor 112, these diodes 102 may still be connected through other via structures, not limited to the resistor 112, for example.

Figure 10:
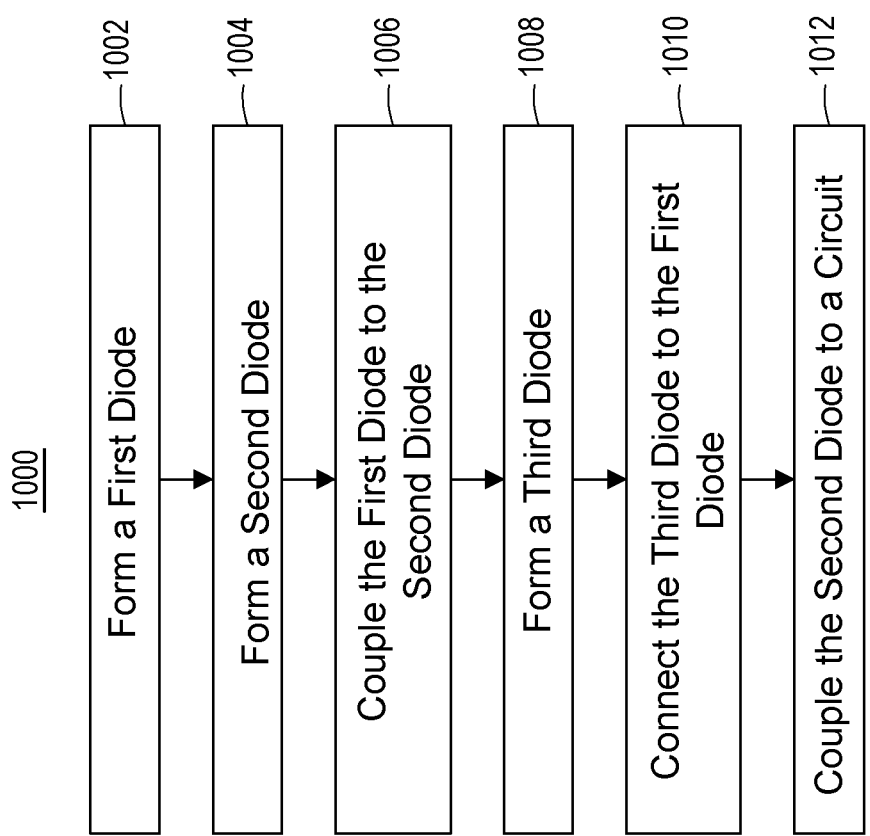
FIG. 10 is an example flow chart of a method for forming a semiconductor device, in accordance with some embodiments.

FIG. 10 is an example flow chart of a method 1000 for forming a semiconductor device, in accordance with some embodiments. It should be noted that the method 1000 is merely an example, and is not intended to limit the present disclosure. Accordingly, it is understood that the order of operation of the method 1000 of FIG. 10 can change, that additional operations may be provided before, during, and after the method 1000 of FIG. 10, and that some other operations may only be described briefly herein. Such a semiconductor device, made by the method 1000, may include one or more components, as discussed above with respect to FIGS. 1-9C. Accordingly, operations of the method 1000 will sometimes be discussed in conjunction with FIGS. 1-9C, as illustrative examples.

At operation 1002, the method 1000 includes forming a first diode (e.g., D1 or the first diode 102*a* of at least FIG. 1). In various implementations, the formation of the diodes, among other structures of the semiconductor device can include various fabrication processes/procedures/operations, such as described in conjunction with but not limited to FIGS. 1-9C. To form the first diode, among other diodes, a substrate having a first conductivity (e.g., P-type) can be deposited or provided as the base substrate. A first well can be deposited over or within a portion of the substrate (e.g., etched portion). The first well can have a second conductivity (e.g., N-type). A first contact region (e.g., OD region) can be deposited over or within the first well, thereby enclosed by the first well. The first contact region can have the first conductivity. With these materials, the first contact region and the first well (e.g., such as the P+/NW (PAD) of at least FIG. 5) can form the first diode. The first diode can have a first cathode and a first anode. For example, the P-type materials (e.g., first conductivity) and N-type materials (e.g., second conductivity) used to form the diode can be associated with the anode and the cathode of the diode, respectively. The first cathode (e.g., the first well) can be floating. The first anode (e.g., the first contact region) can be coupled to an input/output pin (e.g., PAD).

At operation 1004, the method 1000 includes forming a second diode (e.g., D2 or the second diode 102b of at least FIG. 1). To form the second diode a second well can be deposited and enclosed by the substrate. The second well can have the second conductivity (e.g., N-type) similar to the first well. A second contact region can be deposited over or within the second well, such that the second contact region is enclosed by the second well. The second contact region can have the first conductivity (e.g., P-type). Similarly, a third contact region can be deposited and enclosed within the second well. The third contact region can have the second conductivity. The second contact region and the second well (e.g., such as P+/NW (TO INT) of FIG. 5) with the third contact region (e.g., such as N+/NW (VDD) of FIG. 5) can form the second diode. The second diode can include a second anode (e.g., associated with the second contact region) and a second cathode (e.g., associated with the third contact region). The third contact region (e.g., the second cathode) can be coupled to a first supply voltage (e.g., VDD).

At operation 1006, the method 1000 includes coupling the first diode and the second diode. For example, the second contact region (e.g., the second anode of the second diode) can be coupled to the first contact region (e.g., the first anode of the first diode) through/via a metal resistor (e.g., the resistor 112 of FIG. 1 coupling the first anode to the second anode) disposed above the substrate. The first diode has a first size and the second diode has a second size. The first size can be substantially greater than the second size. For example, a ratio of the first size to the second size can be between about 9.5/0.5 and about 7/3, among other values.

In some cases, the size may refer to the length of the contact regions associated with the first diode and the second diode. For example, the first contact region can extend with a first length (e.g., L2 of FIG. 5). The second contact region can extend with a second length (e.g., L1 of FIG. 5). The first length can be substantially greater than the second length, such as similarly to the ratio of the first size to the second size.

In some implementations, a fourth contact region can be deposited and enclosed by the substrate, such as the structure 504 of at least FIG. 5. The fourth contact region can be disposed on a first lateral side of the first and second wells (e.g., first lateral side of the structures 506, 514, 516 of FIG. 5). The fourth contact region can have the second conductivity. In some cases, the fourth contact region can be connected to the second supply voltage (e.g., VSS). In some implementations, a fifth contact region can be deposited and enclosed by the substrate. The fifth contact region can be disposed opposite the fourth contact region from the first and second wells. The fifth contact region may have the first conductivity. The fifth contact region may be associated with the structure 502 of at least FIG. 5, for example. In some cases, the fifth contact region may be connected to the VSS.

At operation 1008, the method 1000 includes forming a third diode (e.g., D3 or the third diode 102c of FIG. 1). To form the third diode, a sixth contact region can be deposited and enclosed by the substrate. The sixth contact region can be disposed on a second lateral side of the first well, such as in the structure 508 of at least FIG. 5. The sixth contact region can have the second conductivity. Further, a seventh contact region can be deposited and enclosed by the substrate. The seventh contact region can be disposed opposite the sixth contact region from the first well, such as in the structure 510 of at least FIG. 5. The seventh contact region can have the first conductivity. The sixth contact region and the substrate with the seventh contact region can form the third diode. The third diode can include a third anode (e.g., associated with the seventh contact region) and a third cathode (e.g., associated with the sixth contact region). The sixth contact region can be coupled to the input/output pin (e.g., PAD 106 of FIG. 1). The seventh contact region can be coupled to the second supply voltage (e.g., VSS).

At operation 1010, the method 1000 includes connecting the third diode to the first diode. The third cathode can be connected or coupled to the first anode at the input/output pin.

At operation 1012, the method 1000 includes coupling the second diode to a circuit (e.g., such as the internal circuit 110 of FIG. 1). For example, the second contact region (e.g., the second anode of the second diode) can be coupled to the circuit that is powered by the first supply voltage and a second supply voltage (e.g., VSS). At least the first to third diodes can operatively serve as an ESD protection circuit that is configured to provide a plural or multiple number of discharge paths from the input/output pin to the second supply voltage, thereby preventing excess current from flowing to the circuit.

In some implementations, the semiconductor device can include additional diodes, such as a fourth diode, a fifth diode, a sixth diode, etc. For example, the method 1000 may include forming a fourth diode (e.g., D4 or the fourth diode 102d of FIG. 1) having a fourth cathode and a fourth anode. To form the fourth diode, an eighth contact region can be deposited and enclosed by the substrate. The eighth contact region can have the second conductivity (e.g., N-type). The eighth contact region can be disposed on the second lateral side of the first well, such as in the structure 512 of at least FIG. 5. The eighth contact region may be perpendicular to the sixth contact region and the first well, for example. The eighth contact region and the substrate with the seventh contact region can form the fourth diode. The seventh contact region can be associated with the fourth anode. The eighth contact region can be associated with the fourth cathode. The fourth cathode can be connected to the second anode of the second diode. The fourth anode can be connected to the second supply voltage. In this case, the fourth diode can provide another discharge path for ESD protection.

The third diode can have a third size, and the fourth diode can have a fourth size. The third size may be substantially greater than the fourth size. In some cases, the third size may be similar to or different from the first size. In some cases, the fourth size may be similar to or different from the second size.

The semiconductor device may include a fifth diode, such as D2 of FIG. 3, where the second diode may be associated with D4 of FIG. 3. The fifth diode can have a fifth cathode and a fifth anode. The fifth cathode can be floating, with the fifth anode coupled to the input/output pin and coupled to the second anode. The fifth anode can be coupled to the input/output pin and the second anode through respectively different metal resistors, such as resistors 304b and 304a, respectively, in at least FIG. 3.

In various configurations, one or more SCRs can be formed or included in the semiconductor device. For example, the first well and the first contact region, such as associated with the structure 506 of FIG. 5, disposed therein can be disposed immediately next to the fourth contact region (e.g., such as the structure 504 of at least FIG. 5) that is coupled to VSS, forming the first SCR (e.g., the SCR 116a associated with the first diode 102*a*) to conduct current through the first contact region, the first well, the substrate, and the fourth contact region. The first contact region, the first well, the substrate, and the fourth contact region can respectively form P-N-P-N layers including three junctions associated with the three terminals of the first SCR.

In another example, the second well and the second contact region disposed therein, such as associated with the structure 514 of at least FIG. 5, can be disposed immediately next to the fourth contact region, forming a second SCR to conduct current through the second contact region, the second well, the substrate, and the fourth contact region. The second contact region, the second well, the substrate, and the fourth contact region can respectively form the P-N-P-N layers including three junctions associated with the three terminals of the second SCR. In some cases, the second SCR may be configured to be formed before the first SCR being formed.

The first SCR can be configured to provide a first discharge path from the first contact region, which is coupled to an input/output pin, to the VSS. The second SCR can be configured to provide a second discharge path from the second contact region, which is coupled to the input/output pin, to the VSS. In some cases, the second SCR may be triggered (e.g., via the trigger voltage) before triggering the first SCR to enable the respective discharge paths during the ESD event.

Figure 11:
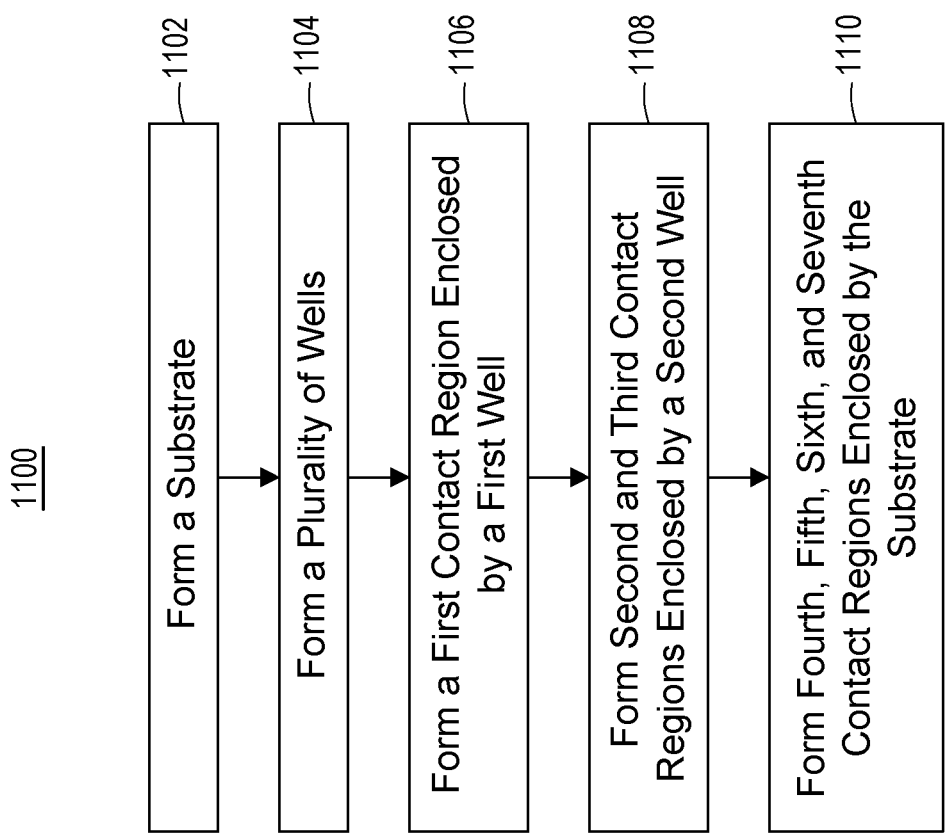
FIG. 11 is an example flow chart of another method for fabricating a semiconductor device, in accordance with some embodiments.

FIG. 11 is an example flow chart of a method 1100 for fabricating a semiconductor device, in accordance with some embodiments. It should be noted that the method 1100 is merely an example, and is not intended to limit the present disclosure. Accordingly, it is understood that the order of operation of the method 1100 of FIG. 11 can change, that additional operations may be provided before, during, and after the method 1100 of FIG. 11, and that some other operations may only be described briefly herein. Such a semiconductor device, made by the method 1100, may include one or more components, as discussed above with respect to FIGS. 1-9C. Accordingly, operations of the method 1000 will sometimes be discussed in conjunction with FIGS. 1-9C, as illustrative examples.

In brief overview, the method 1100 starts with operation 1102 of providing a substrate. The substrate can have a first conductivity (e.g., P-type or N-type, depending on the configuration). For example, the substrate may be a P-type substrate deposited as a base or a first layer. In another example, the substrate may be an N-type substrate deposited as the base or the first layer. The substrate can be deposited as the base or the first layer using at least one suitable deposition technique, such as but not limited to chemical vapor deposition (CVD), physical vapor deposition (PVD), atomic layer deposition (ALD), chemical solution deposition (CSD), or epitaxy growth. The formation of the materials or structures herein can be performed using at least one suitable deposition technique.

An insulation material, such as but not limited to silicon dioxide (SiO2), can be deposited over the substrate to form an insulating layer. A masking material, such as but not limited to silicon nitride (Si3N4) can be deposited over the insulating layer to form a masking layer. The insulating layer and the masking layer can be deposited to have a respective predetermined thickness. Subsequently, an etching process can be performed using the masking layer to form trenches (or define patterns) for insulating the devices, such as to form shallow trench isolation (STI) between the devices (e.g., active devices or contact regions). The etching process can include at least one suitable etching technique, such as but not limited to plasma etching, wet etching, laser ablation, reactive ion etching (RIE), chemical mechanical polishing (CMP), or dry etching. In some cases, after depositing materials, an etching process can be performed, such as but not limited to plasma etching, to remove excess or exposed materials. The trenches can be filled with an insulating material, such as a field oxide (e.g., Sio2) for insulating the contact regions. The filled trenches can be referred to as STI regions.

Next, the method 1100 proceeds to operation 1104 of forming a plurality of wells along a major surface of the substrate. In various embodiments, respective locations and dimensions of the wells can be determined according to the layouts shown in FIGS. 4A-9C. For example, the wells may include P-type semiconductor material (e.g., P-well) or N-type semiconductor material (e.g., N-well), depending on the type of semiconductor device. For instance, a P-well can be formed above the substrate, such as to form a N+/PW diode. In another example, an N-well can be formed above the substrate, such as to form a P+/NW diode. In some embodiments, the semiconductor material for forming a well may not be deposited above the substrate, such as for forming a N+/Psub diode.

For example, to form the wells, dopant ions can be implanted (e.g., ion implantation) into the silicon to create the desired electrical characteristics, turning specific regions into N-type material (e.g., for N-well) or P-type material (e.g., for P-well). As described in conjunction with but not limited to at least FIG. 5, for example, multiple wells can be formed using ions implantation to regions of the device, such as a first well (e.g., associated with the structure 506) and a second well (e.g., associated with structures 514, 516) having a second conductivity different from the substrate. For instance, the second conductivity can be N-type if the first conductivity is P-type. In certain implementations, the implantation can be performed to adjust the threshold voltage of the device.

Next, the method 1100 proceeds to operations 1106-1110 of forming a plurality of contact regions along the major surface of the substrate, including but not limited to a first to seventh contact regions. To form individual contact regions, ion implantation can be performed at the source or drain regions of the device, such as forming P-type contact region or N-type contact region. By performing the ion implantation on the source and drain regions, a gate can be formed for respective transistors, such as N+ polysilicon gate for NMOS and P+ polysilicon gate for PMOS transistors, respectively. In some cases, one or more spacers can be deposited having a predetermined thickness or dimension, for instance, to protect the contact region under the gate from the dopants implanted during source and drain formation, for example.

In various embodiments, respective locations and dimensions of the contact regions, among other materials or structures of the semiconductor device (e.g., diode) can be determined according to the layouts shown in at least one of but not limited to FIGS. 4A-9C. For example, the contact regions (e.g., OD regions) may include at least one of a P-type semiconductor material (e.g., P-type region) or an N-type semiconductor material (e.g., N-type region). One or more of the contact regions can be formed to contact or connect with the VSS (e.g., the second supply voltage), the input/output pin (e.g., the PAD), or the VDD (e.g., the first supply voltage). For example, a P-type region can be formed above the P-well and in contact with the VSS, and an N-type region can be formed above P-well and in contact with the PAD. The p-n junction can form between the P-well and the N-type region, thereby forming the N+/PW diode. In another example, an N-type region can be formed above N-well and in contact with the VDD, and a P-type region can be formed above the N-well and in contact with the PAD. The p-n junction can form between the P-type region and the N-well, thereby forming the P+/NW diode. In the case where the well is not formed above the substrate, the P-type region and the N-type region can be formed above the substrate, where the P-type region can be in contact with the VSS and the N-type region can be in contact with the PAD. In such cases, the substrate (e.g., P-type) and the N-type region can form the p-n junction, thereby forming the N+/Psub diode. The formation of the substrate, the wells, and the contact regions can be described in conjunction with but not limited to at least one of FIGS. 4A-9C, although other configurations or arrangements can be provided to form the p-n junction, not limited to those described herein.

As shown in, but not limited to FIG. 5, for example, first to seventh contact regions can be formed for the semiconductor device. Corresponding to operation 1106, a first contact region can be formed using the techniques discussed hereinabove. The first contact region can be enclosed by the first well (e.g., deposited over or within the first well). The first contact region can have the first conductivity. In this case, the first contact region may be associated with or corresponding to P+/NW (PAD), such as shown in conjunction with at least FIG. 5, for example.

Further to the above example and corresponding to operation 1108, second and third contact regions can be formed for the semiconductor device. The second and third contact regions can be enclosed by the second well. The second contact region can have the first conductivity and the third contact region can have the second conductivity. For example, the second contact region can correspond to the P+/NW (TO INT) and the third contact region can correspond to the N+/NW (VDD), such as shown in conjunction with at least FIG. 5.

Further to the above example and corresponding to operation 1110, fourth, fifth, sixth, and seventh contact regions can be formed for the semiconductor device. The fourth, fifth, sixth, and seventh contact regions can be enclosed by the substrate (e.g., with the first conductivity). For example, the fourth contact region can be disposed on a first lateral side of the first and second wells, and having the second conductivity, e.g., corresponding to N+/PW (VSS), described in conjunction with at least FIG. 5. The fifth contact region can be disposed opposite the fourth contact region from the first and second wells, and having the first conductivity, e.g., corresponding to P+/PW (VSS) described in conjunction with at least FIG. 5. The sixth contact region can be disposed on a second lateral side of the first well, and having the second conductivity, e.g., corresponding to N+/PW (PAD) described in conjunction with at least FIG. 5. The seventh contact region can be disposed opposite the sixth contact region from the first well, and having the first conductivity, e.g., corresponding to P+/PW (VSS) described in conjunction with at least FIG. 5. In some implementations, the seventh contact region may be similar to the fifth contact region. In some cases, the seventh contact region may be a part of the fifth contact region. In some other cases, the seventh contact region may not be included or replaced with the fifth contact region.

In some implementations, one or more diodes can be associated with or formed between certain structures or layers within the semiconductor device. For example, a first diode can be formed having a first cathode and a first anode. The first cathode can be associated with the first contact region. The first anode can be associated with the first well. In this case, the (e.g., electrical) connection between the first contact region and the first well can form the first diode. In another example, a second diode can be formed having a second cathode and a second anode. The second cathode can be associated with the third contact region. The second anode can be associated with the second contact region. In yet another example, a third diode can be formed having a third cathode and a third anode. The third cathode can be associated with the sixth contact region. The third anode can be associated with the fifth contact region In some implementations, one or more SCRs can be associated with or formed between structures or layers within the semiconductor device. For example, a first SCR can be formed to conduct current through the first contact region, the first well, the substrate, and the fourth contact region. In this case, the (e.g., electrical) connections between the first contact region, the first well, the substrate, and the fourth contact region can form the first SCR (e.g., SCR associated with the first diode) of the semiconductor device. In another example, a second SCR can be formed to conduct current through the second contact region, the second well, the substrate, and the fourth contact region. In this case, the (e.g., electrical) connections between the second contact region, the second well, the substrate, and the fourth contact region can form the second SCR (e.g., SCR associated with the second diode) of the semiconductor device. Additional or alternative structures can be fabricated or deposited to form other diodes, SCRs, among other devices.

In one aspect of the present disclosure, a semiconductor device is disclosed. The semiconductor device includes a first diode having a first cathode and a first anode, wherein the first cathode is floating. The semiconductor device includes a second diode having a second cathode and a second anode, wherein the first anode is coupled to the second anode with the second cathode connected to a first supply voltage. The semiconductor device includes a third diode having a third cathode and a third anode, wherein the third cathode is connected to the first anode at an input/output pin, with the third anode connected to a second supply voltage. The second anode is coupled to a circuit that is powered by the first supply voltage and the second supply voltage. The first diode has a first size and the second diode has a second size, and the first size is substantially greater than the second size.

In another aspect of the present disclosure, a semiconductor device is disclosed. The semiconductor device includes a substrate having a first conductivity. The semiconductor device includes a first well enclosed by the substrate and having a second conductivity. The semiconductor device includes a second well enclosed by the substrate and having the second conductivity. The semiconductor device includes a first contact region enclosed by the first well and having the first conductivity. The semiconductor device includes a second contact region enclosed by the second well and having the first conductivity. The semiconductor device includes a third contact region also enclosed by the second well and having the second conductivity. The semiconductor device includes a fourth contact region enclosed by the substrate, disposed on a first lateral side of the first and second wells, and having the second conductivity. The semiconductor device includes a fifth contact region enclosed by the substrate, disposed opposite the fourth contact region from the first and second wells, and having the first conductivity. The semiconductor device includes a sixth contact region enclosed by the substrate, disposed on a second lateral side of the first well, and having the second conductivity. The semiconductor device includes a seventh contact region enclosed by the substrate, disposed opposite the sixth contact region from the first well, and having the first conductivity.

In yet another aspect of the present disclosure, a method for fabricating semiconductor devices is disclosed. The method includes forming a first diode having a first cathode and a first anode, wherein the first diode has a first size, and wherein the first cathode is floating. The method includes forming a second diode having a second cathode and a second anode, wherein the second diode has a second size, and wherein the first size is substantially greater than the second size. The method includes coupling the first anode to the second anode with the second cathode connected to a first supply voltage. The method includes forming a third diode having a third cathode and a third anode. The method includes connecting the third cathode to the first anode at an input/output pin, with the third anode connected to a second supply voltage. The method includes coupling the second anode to a circuit that is powered by the first supply voltage and the second supply voltage.

As used herein, the terms "about" and "approximately" generally indicates the value of a given quantity that can vary based on a particular technology node associated with the subject semiconductor device. Based on the particular technology node, the term "about" can indicate a value of a given quantity that varies within, for example, 10-30% of the value (e.g., +10%, ±20%, or ±30% of the value).

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a first diode having a first cathode and a first anode, wherein the first cathode is floating;
   a second diode having a second cathode and a second anode, wherein the first anode is coupled to the second anode with the second cathode connected to a first supply voltage; and
   a third diode having a third cathode and a third anode, wherein the third cathode is connected to the first anode at an input/output pin, with the third anode connected to a second supply voltage;
   wherein the second anode is coupled to a circuit that is powered by the first supply voltage and the second supply voltage;
   wherein the first diode has a first size and the second diode has a second size, and the first size is substantially greater than the second size.

2. The semiconductor device of claim 1, further comprising:
   a fourth diode having a fourth cathode and a fourth anode;
   wherein the fourth cathode is connected to the second anode, and the fourth anode is connected to the second supply voltage.

3. The semiconductor device of claim 2, wherein the third diode has a third size and the fourth diode has a fourth size, and the third size is substantially greater than the fourth size.

4. The semiconductor device of claim 1, wherein the first anode and the second anode are electrically coupled to each other through a resistor.

5. The semiconductor device of claim 1, further comprising:
   a fifth diode having a fifth cathode and a fifth anode;
   wherein the fifth cathode is floating, with the fifth anode coupled to the input/output pin and coupled to the second anode.

6. The semiconductor device of claim 5, wherein the fifth anode is coupled to the input/output pin and the second anode through respectively different resistors.

7. The semiconductor device of claim 1, wherein a ratio of the first size to the second size is between about 9.5/0.5 and about 7/3.

8. The semiconductor device of claim 1, wherein at least the first to third diodes operatively serve as an electrostatic discharge (ESD) protection circuit that is configured to provide a plural number of discharge paths from the input/output pin to the second supply voltage.

9. A semiconductor device, comprising:
   a substrate having a first conductivity;
   a first well enclosed by the substrate and having a second conductivity;
   a second well enclosed by the substrate and having the second conductivity;
   a first contact region enclosed by the first well and having the first conductivity;
   a second contact region enclosed by the second well and having the first conductivity;
   a third contact region also enclosed by the second well and having the second conductivity;
   a fourth contact region enclosed by the substrate, disposed on a first lateral side of the first and second wells, and having the second conductivity;
   a fifth contact region enclosed by the substrate, disposed opposite the fourth contact region from the first and second wells, and having the first conductivity;
   a sixth contact region enclosed by the substrate, disposed on a second lateral side of the first well, and having the second conductivity; and
   a seventh contact region enclosed by the substrate, disposed opposite the sixth contact region from the first well, and having the first conductivity.

10. The semiconductor device of claim 9, wherein the first contact region and the first well form a first diode, and the first well is floating with the first contact region coupled to an input/output pin.

11. The semiconductor device of claim 9, wherein the second contact region and the second well with the third contact region form a second diode, the second contact region is coupled to the first contact region through a metal resistor disposed above the substrate, and the third contact region is coupled to VDD.

12. The semiconductor device of claim 9, wherein the first contact region extends with a first length and the second contact region extends with a second length, and wherein the first length is substantially greater than the second length.

13. The semiconductor device of claim 9, wherein the sixth contact region and the substrate with the seventh contact region form a third diode, the sixth contact region is coupled to an input/output pin, and the seventh contact region is coupled to VSS.

14. The semiconductor device of claim 9, wherein the first well and the first contact region disposed therein are disposed immediately next to the fourth contact region that is coupled to VSS, forming a first silicon controlled rectifier (SCR) to conduct current through the first contact region, the first well, the substrate, and the fourth contact region.

15. The semiconductor device of claim 14, wherein the second well and the second contact region disposed therein are disposed immediately next to the fourth contact region, forming a second SCR to conduct current through the second contact region, the second well, the substrate, and the fourth contact region.

16. The semiconductor device of claim 15, wherein the second SCR is configured to be formed prior to the first SCR being formed.

17. The semiconductor device of claim 15, wherein the first SCR is configured to provide a first discharge path from the first contact region, which is coupled to an input/output pin, to the VSS, and the second SCR is configured to provide a second discharge path from the second contact region, which is coupled to the input/output pin, to the VSS.

18. A method for fabricating semiconductor devices, comprising:
   forming a substrate having a first conductivity;
   forming a plurality of wells enclosed by the substrate and having a second conductivity, the plurality of wells comprising a first well and a second well;
   forming a first contact region enclosed by the first well and having the first conductivity;
   forming a second contact region enclosed by the second well and having the first conductivity;
   forming a third contact region also enclosed by the second well and having the second conductivity;
   forming a fourth contact region enclosed by the substrate, disposed on a first lateral side of the first and second wells, and having the second conductivity;
   forming a fifth contact region enclosed by the substrate, disposed opposite the fourth contact region from the first and second wells, and having the first conductivity;
   forming a sixth contact region enclosed by the substrate, disposed on a second lateral side of the first well, and having the second conductivity; and
   forming a seventh contact region enclosed by the substrate, disposed opposite the sixth contact region from the first well, and having the first conductivity.

19. The method of claim 18, wherein:
   a first diode is formed having a first cathode and a first anode, the first cathode associated with the first contact region and the first anode associated with the first well;
   a second diode is formed having a second cathode and a second anode, the second cathode associated with the third contact region and the second anode associated with the second contact region; and
   a third diode is formed having a third cathode and a third anode, the third cathode associated with the sixth contact region and the third anode associated with the fifth contact region.

20. The method of claim 18, wherein:
   a first silicon controlled rectifier (SCR) is formed to conduct current through the first contact region, the first well, the substrate, and the fourth contact region; and
   a second SCR is formed to conduct current through the second contact region, the second well, the substrate, and the fourth contact region.

* * * * *